(12) United States Patent
Abadeer et al.

(10) Patent No.: US 7,795,940 B2
(45) Date of Patent: Sep. 14, 2010

(54) MICRO-PHASE ADJUSTING AND MICRO-PHASE ADJUSTING MIXER CIRCUITS DESIGNED WITH STANDARD FIELD EFFECT TRANSISTOR STRUCTURES

(75) Inventors: Wagdi W. Abadeer, Jericho, VT (US); Anthony R. Bonaccio, Shelburne, VT (US); Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/573,910

(22) Filed: Oct. 6, 2009

(65) Prior Publication Data

US 2010/0019816 A1 Jan. 28, 2010

Related U.S. Application Data

(62) Division of application No. 11/833,567, filed on Aug. 3, 2007, now abandoned.

(51) Int. Cl.
*H03K 3/00* (2006.01)
*H03H 11/16* (2006.01)
*H03K 5/13* (2006.01)

(52) U.S. Cl. ............... 327/237; 327/261; 327/231; 327/175

(58) Field of Classification Search ......... 327/231–237, 327/175, 626, 261
See application file for complete search history.

(56) References Cited

U.S. PATENT DOCUMENTS

| | | | |
|---|---|---|---|
| 3,731,122 A | 5/1973 | Rosenbaum et al. | |
| 3,898,479 A | 8/1975 | Proebsting | |
| 4,500,800 A | 2/1985 | Cases et al. | |
| 4,596,959 A | 6/1986 | Kawakami | |
| 4,629,993 A | 12/1986 | Bouvier et al. | |
| 4,638,190 A * | 1/1987 | Hwang et al. | ............... 327/237 |
| 4,691,302 A | 9/1987 | Mattausch | |
| 4,994,773 A | 2/1991 | Chen et al. | |
| 5,012,143 A | 4/1991 | Boudewijns | |

(Continued)

OTHER PUBLICATIONS

Abadeer et al., U.S. Appl. No. 11/873,515, Office Action Communication, Feb. 26, 2010, 9 pages.

(Continued)

*Primary Examiner*—Lincoln Donovan
*Assistant Examiner*—Adam D Houston
(74) *Attorney, Agent, or Firm*—Gibb I.P. Law Firm, LLC

(57) ABSTRACT

Disclosed herein are embodiments of a programmable phase adjusting circuit, a programmable phase adjusting mixer circuit and design structures for these circuits. These circuits comprise a variable delay device connected between input and output nodes. The device includes multiple FETs with input diffusion regions that are connected to a voltage rail via switches so that they can be selectively biased, gates that are connected in series to the input node so that a periodic input signal can be propagated sequentially through each of the gates and output diffusion regions that are connected in parallel to the output node. A current source is connected between the output node and another voltage rail for biasing the output node when the variable delay device is off. The variable delay device enables a circuit in which small increments of selectable phase adjustments can be made to the periodic input signal as a function of propagation delay.

20 Claims, 10 Drawing Sheets

U.S. PATENT DOCUMENTS

| | | | | |
|---|---|---|---|---|
| 5,111,085 | A * | 5/1992 | Stewart | 327/278 |
| 5,121,014 | A | 6/1992 | Huang | |
| 5,144,174 | A | 9/1992 | Murakami | |
| 5,146,306 | A | 9/1992 | Ferry et al. | |
| 5,218,237 | A | 6/1993 | Mao | |
| 5,227,679 | A | 7/1993 | Woo | |
| 5,400,370 | A * | 3/1995 | Guo | 375/371 |
| 5,451,894 | A * | 9/1995 | Guo | 327/241 |
| 5,548,237 | A * | 8/1996 | Iadanza et al. | 327/281 |
| 5,550,728 | A | 8/1996 | Ellis | |
| 5,637,900 | A | 6/1997 | Ker et al. | |
| 5,663,670 | A * | 9/1997 | Iadanza et al. | 327/281 |
| 5,714,784 | A | 2/1998 | Ker et al. | |
| 5,717,622 | A | 2/1998 | Kawamoto et al. | |
| 5,754,380 | A | 5/1998 | Ker et al. | |
| 5,764,093 | A | 6/1998 | Hayashi et al. | |
| 5,770,960 | A * | 6/1998 | Iadanza et al. | 327/281 |
| 5,815,009 | A * | 9/1998 | Iadanza et al. | 327/5 |
| 5,852,315 | A | 12/1998 | Ker et al. | |
| 5,877,713 | A * | 3/1999 | Marie | 341/122 |
| 5,894,239 | A * | 4/1999 | Bonaccio et al. | 327/176 |
| 5,920,203 | A | 7/1999 | Bailey et al. | |
| 6,087,875 | A | 7/2000 | Defaxio | |
| 6,169,438 | B1 * | 1/2001 | Wu et al. | 327/276 |
| 6,259,294 | B1 | 7/2001 | Murakami et al. | |
| 6,304,124 | B1 | 10/2001 | Mizuno | |
| 6,320,480 | B1 * | 11/2001 | Kintis et al. | 333/156 |
| 6,429,710 | B1 | 8/2002 | Ting et al. | |
| 6,593,789 | B2 * | 7/2003 | Atallah et al. | 327/175 |
| 6,664,837 | B1 * | 12/2003 | Oh et al. | 327/270 |
| 6,680,636 | B1 * | 1/2004 | Parry et al. | 327/161 |
| 6,747,504 | B2 * | 6/2004 | Simpson et al. | 327/400 |
| 6,859,082 | B2 * | 2/2005 | Tang | 327/276 |
| 6,867,716 | B2 | 3/2005 | Zhang | |
| 7,030,426 | B2 | 4/2006 | Neidig | |
| 7,034,577 | B2 | 4/2006 | Kawasumi | |
| 7,036,098 | B2 | 4/2006 | Eleyan et al. | |
| 7,124,385 | B2 | 10/2006 | McGuinness et al. | |
| 7,161,394 | B2 | 1/2007 | Lee | |
| 7,180,352 | B2 | 2/2007 | Mooney et al. | |
| 7,212,055 | B2 * | 5/2007 | Yoo et al. | 327/175 |
| 7,382,171 | B2 * | 6/2008 | Ogawa et al. | 327/263 |
| 7,403,055 | B2 * | 7/2008 | Minzoni | 327/175 |
| 7,456,665 | B2 * | 11/2008 | Hinz et al. | 327/158 |
| 7,498,859 | B2 * | 3/2009 | Kim | 327/262 |
| 7,525,077 | B2 | 4/2009 | Kim et al. | |
| 7,536,663 | B2 * | 5/2009 | Matsumiya | 716/6 |
| 2002/0079925 | A1 | 6/2002 | Dietrich et al. | |
| 2002/0140484 | A1 | 10/2002 | Komura et al. | |
| 2003/0001650 | A1 * | 1/2003 | Cao et al. | 327/277 |
| 2004/0075481 | A1 * | 4/2004 | Reuveni et al. | 327/271 |
| 2004/0090254 | A1 | 5/2004 | Owens et al. | |
| 2005/0012836 | A1 * | 1/2005 | Guidash | 348/302 |
| 2007/0103215 | A1 * | 5/2007 | Boerstler et al. | 327/175 |
| 2007/0115035 | A1 * | 5/2007 | Hinz et al. | 327/156 |
| 2007/0247203 | A1 * | 10/2007 | Cho et al. | 327/175 |
| 2007/0247205 | A1 * | 10/2007 | Kim | 327/237 |

OTHER PUBLICATIONS

Baker et al., "A Waffle Layout Technique Strengthens the ESD Hardness of the NMOS Output Transistor," 1989, EOS/ESD Symposium Proceedings, pp. 175-181.

Hastings, A., "The Art of Analog Layout," Prentice Hall, Chapter 12, pp. 416-417.

* cited by examiner

| | 161 | 162 | 163 | 164 | 165 | 166 | 167 | 168 | Select Lines/ Phase Adjust |
|---|---|---|---|---|---|---|---|---|---|
| Example #1, Bias Input Diffusion Region 143 → | 1 | 0 | 0 | 0 | 0 | 0 | 0 | 0 | 1 Increment |
| | 0 | 1 | 0 | 0 | 0 | 0 | 0 | 0 | 2 Increments |
| | 0 | 0 | 1 | 0 | 0 | 0 | 0 | 0 | 3 Increments |
| | 0 | 0 | 0 | 1 | 0 | 0 | 0 | 0 | 4 Increments |
| | 0 | 0 | 0 | 0 | 1 | 0 | 0 | 0 | 5 Increments |
| | 0 | 0 | 0 | 0 | 0 | 1 | 0 | 0 | 6 Increments |
| | 0 | 0 | 0 | 0 | 0 | 0 | 1 | 0 | 7 Increments |
| | 0 | 0 | 0 | 0 | 0 | 0 | 0 | 1 | 8 Increments |

Figure 2

Latency In Series Connection Between Of Gates

Signal At Output Node 30 With Only One Select Line On

| Select Lines | 161 | 162 | 163 | 164 | 165 | 166 | 167 | 168 | In-1 to Out-0 Controlled By | In-0 to Out-1 Controlled By |
|---|---|---|---|---|---|---|---|---|---|---|
| Example #1 | 0 | 1 | 0 | 0 | 0 | 1 | 0 | 0 | 162 | 166 |
| Example #2 | 1 | 0 | 0 | 1 | 0 | 0 | 1 | 0 | 161 | 167 |

Figure 4

MICRO-PHASE ADJUSTING AND MICRO-PHASE ADJUSTING MIXER CIRCUITS DESIGNED WITH STANDARD FIELD EFFECT TRANSISTOR STRUCTURES

CROSS-REFERENCE TO RELATED APPLICATIONS

This application is a Continuation of U.S. application Ser. No. 11/853,567 filed Aug. 3, 2007, the complete disclosure of which, in its entirety, is herein incorporated by reference. This application is also related to U.S. application Ser. No. 11/833,538 filed Aug. 3, 2007, The complete disclosure of this co-pending application is incorporated herein by reference.

BACKGROUND

1. Field of the Invention

The embodiments of the invention generally relate to phase adjusting and phase adjusting mixer circuits and, more particularly, to phase adjusting and phase adjusting mixer circuits that incorporate a variable delay device having multiple individually selectable field effect transistors (FETs) for selectively programming delay. The embodiments of the invention further relate to design structures embodied in a machine readable medium for designing and manufacturing such micro-phase adjusting and micro-phase adjusting mixer circuits.

2. Description of the Related Art

With recent advances in semiconductor technology, integration levels have increased to the point where the functional capabilities of a single system-on-a-chip (SOC) produced today may exceed those of an entire computer that was produced less than five years ago. For example, complex analog functions (e.g., physical layer transceivers and high speed serial interfaces) are routinely integrated into such SOCs. Operation of such high speed interfaces commonly requires a means of phase synchronization to correctly sample incoming data. Today, phase synchronization is typically accomplished using a phase rotator designed to mix several phase-related signals to create a selectable phase offset However, while adequate for current clock speeds and de-serialization usage, these phase rotators are large, expensive, complex and have limited frequency/granularity.

Technological advancements have also recently been made allowing for embedded radio frequency (RF) functions within larger digital integrated circuits. These RF functions may see performance benefit if clocks can be more tightly aligned using phase shifters. Furthermore, current logic designs often require delay of clock or data signals in order to correct for timing (setup or hold) violations in various logic paths. However, because analog functions (e.g., phase rotators and delayed locked loops (DLLs)) are expensive to implement, phase adjusting circuits that incorporate fixed delay cells are typically used. Such phase adjusting circuits use a path of delay cells (e.g., inverters) designed to provide a significant fixed (i.e. non-programmable) delay that varies over process, voltage and temperature (PVT) with other logic cells. The delay variation between best case (BC) PVT and worst case (WC) PVT may be more than 2 times. Because of this, a circuit designer must often balance the need for adding delay to a path to correct timing issues at the BC corner with the increase in delay at the WC corner. Therefore, there is a need in the art for a circuit topology which provides for low cost programmable input signal phase-adjustment capability in order to fine tune input signal arrival and data synchronization in digital systems.

SUMMARY

In view of the foregoing, disclosed herein are embodiments of a programmable phase adjusting circuit, a programmable phase adjusting mixer circuit and design structures for these circuits. The programmable phase adjusting circuit comprises a variable delay device connected between an input node for receiving a signal requiring phase adjustment and an output node for outputting a phase adjusted signal. The variable delay device is made up of multiple propagation field effect transistors (propagation FETs). The propagation FETs have input diffusion regions that are connected to a voltage rail via switches so that they can be selectively biased, gates that are connected (i.e., coupled) in series to the input node such that the signal requiring phase adjustment can be propagated to each of the gates sequentially and output diffusion regions that are connected in parallel to the output node. A current source (i.e., load device) is connected between the output node and another voltage rail (e.g., a power source) and is adapted to bias the output node when the variable delay device is off. This load device can be constant, non-constant and dependent upon the signal at the input node or, as in a phase adjusting mixer circuit, non-constant and independent of the signal at the input node. This variable delay device enables a phase adjusting circuit in which small increments of selectable phase adjustments can be made to a periodic input signal as a function of which propagation FET(s) is/are selected (i.e., as a function of propagation delay). During design, the delay can be tuned by varying the size of the propagation FETs, by incorporating resistance (salicided or non-salicided) into the series connection of the gates and/or by incorporating capacitance into series connection of the gates.

More particularly, disclosed herein are embodiments of a programmable phase adjusting circuit. This circuit can comprise an input node, an output node and a variable delay device connected between the input and output nodes. Specifically, the input node can be adapted to receive a first signal (e.g., a periodic signal requiring phase adjustment) from another device (e.g., from another logic circuit, a clock driver, etc.) that is connected to the input node and that is logically positioned before the phase adjusting circuit.

The variable delay device (i.e., a programmable delay device) can comprise a plurality of propagation field effect transistors (FETs), where each propagation FET comprises an input diffusion region, a gate and an output diffusion region. The input diffusion regions of each of the propagation FETs are adapted to be selectively biased. That is, each input diffusion region is connected via a corresponding switch to a voltage rail (e.g., to ground) so as to allow individual and selective biasing of one or more selected FET(s) at a time. Each switch can comprise, for example, a selection FET controlled by a corresponding select line. The gates of the propagation FETs are connected (i.e., coupled) in series to the input node (i.e., the input node and the gates form a series connection). The output diffusion regions of the propagation FETs are connected in parallel to the output node. A current source (i.e., a load device) is connected between another voltage rail (e.g., a power supply) and the output node. This current source is adapted to bias the output node when all of said field effect transistors are off.

Given the above-described phase adjusting circuit configuration, when the first signal (i.e., the signal requiring phase adjustment) is driven into the input node, this signal is propagated from the input node to each of the gates sequentially. Furthermore, when an active edge of this first signal reaches the first gate in the series connection, the channel region between the input and output diffusion regions of the first field effect transistor is enabled. Next, when the active edge of this first signal reaches the second gate in the series connection, the channel region between the input and output diffusion regions of the second field effect transistor is enabled. This continues until finally the active edge of this first signal reaches the last gate in the series connection, thereby enabling the channel region between the input and output diffusion regions of the last field effect transistor. Although the active edge of the input signal will enable each of these channels in sequence, for each unselected switch (i.e., for each unselected FET), impedance will remain high in the corresponding input diffusion region, thereby preventing any impact on circuit output. That is, although the channels are enabled, a second signal (i.e., a phase adjusted signal) is not transmitted to the output node until an input diffusion region is selectively biased. Consequently, phase adjustment of the first signal is a function of propagation delay of the first signal through the series connection of the gates and a function of which one or more of the propagation FETs is selected (i.e., which one or more of the input diffusion regions are selectively biased).

More specifically, during operation of this phase adjusting circuit, a single propagation FET can be selected (i.e., a single input diffusion region of a single propagation FET can be selectively biased). When the input diffusion region is biased, impedance will go low in that input diffusion region but will remain high in the input diffusion regions of all of the other non-selected propagation FETs. Then, when the first signal is propagated sequentially to the gates and the active edge of the first signal passes through the gate of the selected propagation FET, a channel (i.e., an electrical connection) will be enabled between the biased input diffusion region of the selected propagation FET and its output diffusion region. Biasing the input region of the selected propagation FET allows a second signal (i.e., a phase adjusted signal) to be transmitted through the selected propagation FET to the output node once the channel is enabled. The second signal is combined at the output node with the load of the current source (i.e., with the load device). Additionally, the first signal continues to be propagated to the gates in the series connection in sequence and, as the inactive edge of the first signal passes through the gate of the selected propagation FET, the electrical connection will be broken (i.e., transmission of the second signal to the output node is broken).

The phase difference between the first and second signals is based in part on which propagation FET is selected (i.e., which input diffusion region is selectively biased) relative to the originating point of the first signal. That is, the greater the electrical distance (i.e., delay due to built-in resistance and capacitance) between the selected propagation FET and the input node, the greater the propagation delay and, thus, the greater the phase adjustment. Contrarily, the closer the electrical distance between the selected propagation FET and the input node, the smaller the phase adjustment will be.

Alternatively, during operation of this phase adjusting circuit, multiple propagation FETs can be selected (i.e., multiple input diffusion regions corresponding to multiple propagation FETs can be selectively and simultaneously biased). When multiple input diffusion regions are selectively biased, impedance will remain high in the input diffusion regions of all of the other non-selected propagation FETs. When the first signal is driven into the input node and propagated sequentially to each of the gates in the series connection, channels will be enabled between the input diffusion regions and the output diffusion regions of each propagation FET. However, as the active edge of the first signal reaches the gate of the first selected FET (i.e., the first FET having a biased input diffusion region), a second signal (i.e., a phase adjusted signal) will begin passing through the first selected propagation FET to its corresponding output diffusion region. When the active edge of the first signal passes through the gate of the second selected propagation FET (i.e., the next FET having a biased input diffusion region), nothing happens because the second signal has already been propagated. Similarly, when the inactive edge of the first signal passes through the gate of the first selected propagation FET, nothing happens because the output node continues to be driven to the second signal due to the biasing of the input diffusion region of the second selected propagation FET. Only when the inactive edge of the first signal passes through the gate of the last selected propagation FET (i.e., the last FET having a biased input diffusion region) is the electrical connection broken (i.e., is transmission of the second signal broken), thereby allowing the output node to again be controlled by the current source. Thus, not only is the phase of the first signal adjusted, but also the length (i.e., the pulse width).

Delay and, thus, phase-adjustment is based, not only on which propagation FET(s) is/are selected (i.e., which input diffusion regions are selectively biased), but also on resistance and capacitance within the series connection of the gates (i.e., RC delay). Thus, the variable delay device in the phase adjusting circuit can further be designed with propagation FETs having different sizes, with resistance (salicided or non-salicided) incorporated into the series connection of the gates and/or with capacitance incorporated into the series connection of the gates so as to fine tune the incremental changes in delay. Specifically, the propagation FETS of the variable delay device can have uniform sizes so as to provide uniform delay increments or varying sizes so as to provide non-uniform delay increments or to compensate for other delay inducing features in the circuit in order to ensure uniform delay increments. Additionally, the variable delay device can comprise one or more resistors connected between nodes in the series connection of the gates and/or capacitors connected at a node in the series connection of the gates. Finally, the series connection of the gates can comprise only silicide regions, only non-silicide region or a mixture of silicide and non-silicide regions, for example, on the gates themselves and/or between the gates.

As mentioned above, the current source (i.e., the load device) is connected between the output node and a voltage rail (e.g., a power source) and is adapted to bias the output node when all of the propagation FETs are turned off. At the output node, the phase adjusted signal is combined with the load of the current source. In one embodiment of the phase adjusting circuit, this current source is a constant current source comprising, for example, a biased FET, a diode-connected FET, or any other suitable device that is sized to provide appropriate signal swing)).

Alternatively, in another embodiment of the invention, the current source (i.e., the load device) can be non-constant, but dependent upon the same first signal as the variable delay device. For example, the current source of the phase adjusting circuit in this embodiment can comprise at least one additional delay device that is also connected between the input and output nodes of the phase adjusting circuit. This additional delay device can comprise a non-variable delay device, a second variable delay device configured in the same manner as the variable delay device described above, or any other suitable delay device. As with the variable delay device, this additional delay device can be adapted to receive the first signal and simultaneously, but independently, phase adjust the first signal. Thus, in this embodiment the output node is adapted to combine the separate phase adjusted signals from both the different delay devices (i.e., from the variable delay device and the additional delay device) such that the final output of the phase adjusting circuit is a single combined phase adjusted signal.

In yet another embodiment, the phase adjusting circuit can comprise a current source (i.e., the load device) that is both non-constant and not dependent upon the first signal at the input node. Thus, this circuit functions as both a phase adjusting circuit and a mixer circuit. That is, in a phase adjusting mixer circuit embodiment, the current source can be electrically connected to the output node, but not the input node. Additionally, this current source can be a time-varying current source (e.g., an alternating current (AC) source or a periodic current source) adapted to transmit a third signal to the output node. Thus, the output node receives and combines the phase adjusted signal (i.e., the second signal) from the variable delay device with the third signal from the current source such that the final output of the phase adjusting mixer circuit comprises a fourth signal.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 2 is a table illustrating selective behavior in the phase adjusting circuit of FIG. 1;

FIG. 4 is a table illustrating two examples of alternative selective behavior in the phase adjusting circuit of FIG. 1;

DETAILED DESCRIPTION OF EMBODIMENTS

Figure 1:
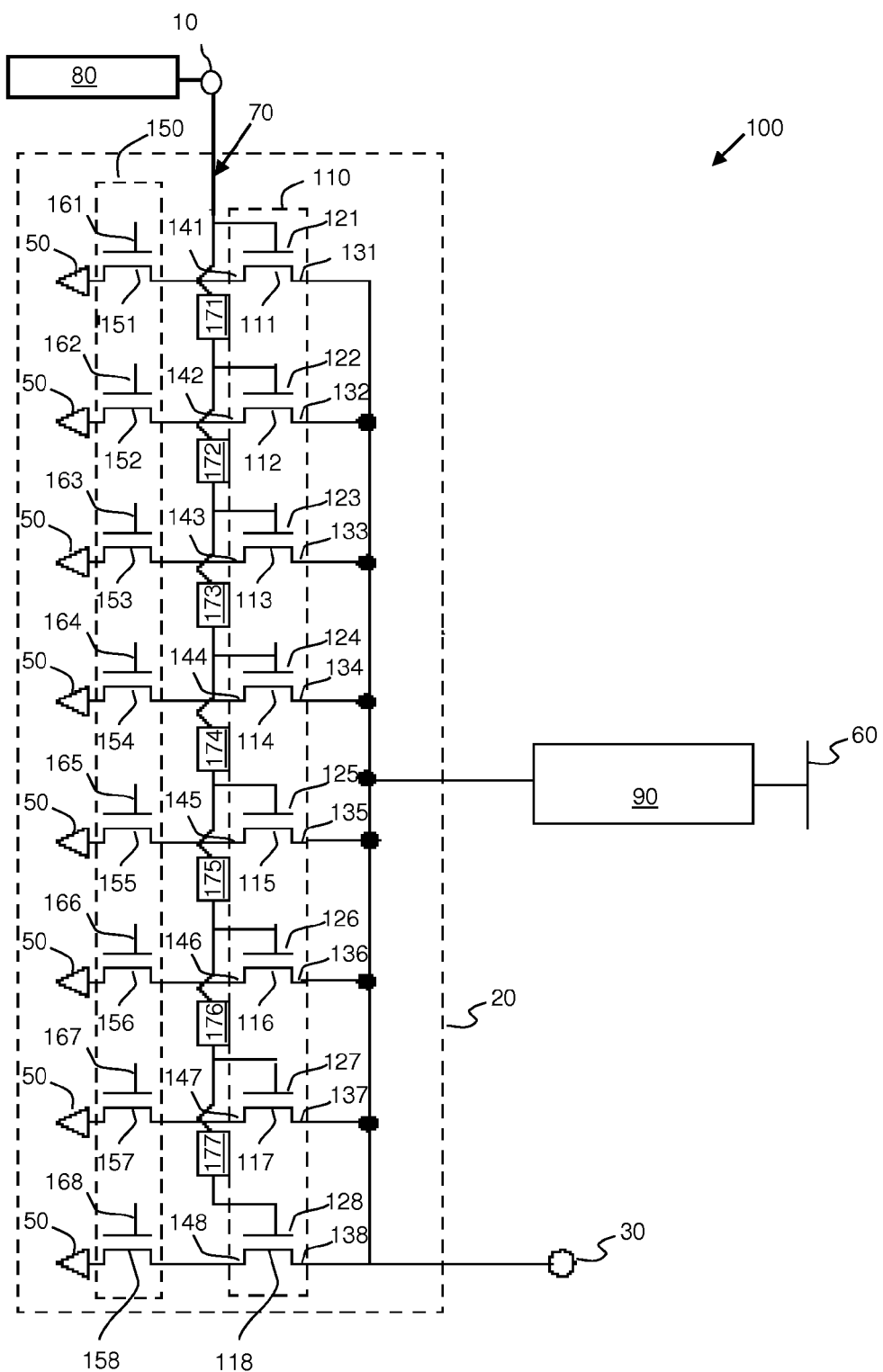
FIG. 1 is a schematic diagram illustrating an embodiment of a phase adjusting circuit.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, with recent advances in semiconductor technology, integration levels have increased to the point where the functional capabilities of a single system-on-a-chip (SOC) produced today may exceed those of an entire computer that was produced less than five years ago. For example, complex analog functions (e.g., physical layer transceivers and high speed serial interfaces) are routinely integrated into such SOCs. Operation of such high speed interfaces commonly requires a means of phase synchronization to correctly sample incoming data. Today, phase synchronization is typically accomplished using a phase rotator designed to mix several phase-related signals to create a selectable phase offset However, while adequate for current clock speeds and de-serialization usage, these phase rotators are large, expensive, complex and have limited frequency/granularity.

Technological advancements have also recently been made allowing for embedded radio frequency (RF) functions within larger digital integrated circuits. These RF functions may see performance benefit if clocks can be more tightly aligned using phase shifters. Furthermore, current logic designs often require delay of clock or data signals in order to correct for timing (setup or hold) violations in various logic paths. However, because analog functions (e.g., phase rotators and delayed locked loops (DLLs)) are expensive to implement, phase adjusting circuits that incorporate fixed delay cells are typically used. Such phase adjusting circuits use a path of delay cells (e.g., inverters) designed to provide a significant fixed (i.e. non-programmable) delay that varies over process, voltage and temperature (PVT) with other logic cells. The delay variation between best case (BC) PVT and worst case (WC) PVT may be more than 2 times. Because of this, a circuit designer must often balance the need for adding delay to a path to correct timing issues at the BC corner with the increase in delay at the WC corner. Therefore, there is a need in the art for a circuit topology which provides for low cost programmable input signal phase-adjustment capability in order to fine tune input signal arrival and data synchronization in digital systems.

In view of the foregoing, disclosed herein are embodiments of a programmable phase adjusting circuit, a programmable phase adjusting mixer circuit and design structures for these circuits. The programmable phase adjusting circuit comprises a variable delay device connected between an input node for receiving a signal requiring phase adjustment and an output node for outputting a phase adjusted signal. The variable delay device is made up of multiple propagation field effect transistors (propagation FETs). The propagation FETs have input diffusion regions that are connected to a voltage rail via switches so that they can be selectively biased, gates that are connected (i.e., coupled) in series to the input node such that the signal requiring phase adjustment can be propagated to each of the gates sequentially and output diffusion regions that are connected in parallel to the output node. A current source (i.e., load device) is connected between the output node and another voltage rail (e.g., a power source) and is adapted to bias the output node when the variable delay device is off. This load device can be constant, non-constant and dependent upon the signal at the input node or, as in a phase adjusting mixer circuit, non-constant and independent of the signal at the input node. This variable delay device enables a phase adjusting circuit in which small increments of selectable phase adjustments can be made to a periodic input signal as a function of which propagation FET(s) is/are selected (i.e., as a function of propagation delay). During design, the delay can be tuned by varying the size of the propagation FETs, by incorporating resistance (salicided or non-salicided) into the series connection of the gates and/or by incorporating capacitance into series connection of the gates.

More particularly, referring to FIG. 1, disclosed herein are embodiments of a programmable phase adjusting circuit 100. This circuit 100 can comprise an input node 10 for receiving a periodic signal requiring phase adjustment, an output node 30 for outputting a phase adjusted signal and a variable delay device 20 connected between the input and output nodes.

The variable delay device 20 (i.e., a programmable delay device) can comprise a plurality of propagation field effect transistors (FETs) 111-118 and a plurality of corresponding selection switches 151-158 (e.g., selection FETs). Each propagation FET 111-118 comprises an input diffusion region 141-148, a gate 121-128 and an output diffusion region 131-138. The input diffusion regions 141-148 of each of the propagation FETs 111-118 are adapted to be selectively biased. That is, each input diffusion region is connected via a corresponding switch 151-158 to a voltage rail (e.g., ground 50) so as to allow individual and selective biasing of the input diffusion region of one or more selected FET(s) at a time. For example, each switch 151-158 can comprise a selection FET having an input diffusion region connected to ground, an output diffusion region connected to the input diffusion region of a corresponding propagation FET and a gate controlled by corresponding select line 161-168. Thus, the variable delay device can be constructed of a plurality of FET pairs {151,111}, {152, 112}, {153, 113}, etc., where each pair includes a selection FET and a propagation FET.

The gates 121-128 of the propagation FETs 111-118 are connected (i.e., coupled) in series to the input node 10 (i.e., the input node and the gates form a series connection 70). The input node 10 can be adapted to receive a first signal (e.g., a periodic signal requiring phase adjustment) from another device 80 (e.g., from another logic circuit, a clock driver, etc.) that is connected to the input node 10 and that is logically positioned before the phase adjusting circuit 100.

The output diffusions regions 131-138 of the propagation FETs 111-118 are connected in parallel to the output node 30. A current source 90 (i.e., a load device) is connected between another voltage rail (e.g., a power supply 60) and the output node 30. This current source 90 is adapted to bias the output node 30 when all of said field effect transistors 111-118 are off. The load device 90 and the variable delay device 20 in combination work to drive the output node 30 in accordance with an input signal at the input node 10.

Given the above-described phase adjusting circuit 100 configuration, when the first signal (i.e., the signal requiring phase adjustment) is driven into the input node 10, this signal is propagated from the input node 10 to each of the gates 121-128 sequentially such that the signal does not reach a downstream gate until it has first passed through an earlier gate. As the input signal propagates from the first gate 121 to the last gate 128 in the series connection 70, it encounters a number of intrinsic delays (IDs) 171-177 built into the system. The intrinsic delays 171-177 represent the intrinsic RC delay as the input signal passes from gate to gate.

Furthermore, when an active edge of this first signal reaches the first gate 121 in the series connection 70, the channel region between the input and output diffusion regions 141, 131 of the first field effect transistor 111 is enabled. Next, when the active edge of this first signal reaches the second gate 122 in the series connection 70, the channel region between the input and output diffusion regions 142, 132 of the second field effect transistor 112 is enabled. This continues until finally the active edge of this first signal reaches the last gate 128 in the series connection 70, thereby enabling the channel region between the input and output diffusion regions 148, 138 of the last field effect transistor 118.

Although the active edge of the input signal will enable each of these channels in sequence, for each unselected switch (i.e., for each unselected FET), impedance will remain high in the corresponding input diffusion region, thereby preventing any impact on circuit output. That is, although the channels are enabled, a second signal (i.e., a phase adjusted signal) is not transmitted to the output node 30 until an input diffusion region is selectively biased. Consequently, phase adjustment of the first signal is a function of propagation delay of the first signal through the series connection of the gates 70 and a function of which one or more of the propagation FETs is selected (i.e., which one or more of the input diffusion regions are selectively biased).

For the purposes of this disclosure, an active edge of the first signal refers to the point in the periodic signal wave at which the value of the signal is such that it is able to turn on or invert the FETs 111-118. Contrarily an inactive edge is the point in the periodic signal wave at which the value of the signal is such that it is able to turn off the FETs 111-118.

During operation of this phase adjusting circuit 100, a single propagation FET (e.g., 113) can be selected. Referring to the table of FIG. 2 in combination with FIG. 1, seven of the eight control lines 161-168 that control switches 151-158, respectively, can be held inactive (at 0) with a single select line held active (at 1). Example #1 illustrates that a single input diffusion region 143 of a single propagation FET 113 can be selectively biased by turning on switch 153 via control line 163 and, thereby, connecting the input diffusion region 143 to a voltage rail (e.g., to ground 50). When the input diffusion region 143 is biased, impedance will go low in that input diffusion region 143. However, impedance will remain high in the input diffusion regions 141-142 and 144-148 of all of the other non-selected propagation FETs 111-112 and 114-118 because, although these other input diffusion regions are coupled to their respective output diffusion regions, they are not connected to a voltage rail (i.e., they are not connected to ground 50). Thus, they effectively float and follow the bias of the output node 30 as their respective gates are activated.

When the signal wave (i.e., the first signal from the device 80 requiring phase adjustment) is injected into the input node 10, it will pass to the first gate 121 in the series connection 70 closest to the input node 10. As an active edge of the first signal is propagated to the gates sequentially (i.e., through the series connection 70) and reaches the gate 123 of the selected propagation FET 113, a channel (i.e., an electrical connection) will be enabled between the biased input diffusion region 143 of the selected propagation FET 113 and its output diffusion region 133. Biasing the input diffusion region 143 of the selected propagation FET 113 allows a second signal (i.e., a phase adjusted signal) to be transmitted through the selected propagation FET 113 to the output node 30 once the channel is enabled. That is, if the selection FET 153 and the propagation FET 113 are n-type and if the current source 90 is p-type, then propagation of a high voltage through the gate 123 will pull down the output diffusion region 133 of FET 113, when the input diffusion region 143 is biased. Then, at the output node 30, the second signal (i.e., the phase adjusted signal) is combined with the load of the current source 90 (i.e., with the load of the load device). Finally, the first signal continues to be propagated sequentially to the gates in the series connection 70 and, as the inactive edge of the first signal passes through the gate 123 of the selected propagation FET 113, the electrical connection will be broken (i.e., transmission of the second signal to the output node 30 is broken).

The phase difference between the first and second signals is based in part on which propagation FET is selected (i.e., which input diffusion region is selectively biased) relative to the originating point of the first signal. That is, because the propagation FETs 111-118 are connected with their gates 121-128 in series, the arrival time of the first signal (i.e., the periodic signal requiring phase adjustment) at each of the gates 121-128 varies, thus, the delay, or phase change between the input signal and the corresponding transition at the output node 30 is dependent on which selection FET 151-158 is enabled and the propagation delay from gate 121 to gate 128 in the series connection 70. Thus, the greater the electrical distance (i.e. the delay from one gate to the next gate in the series connection due to the resistance and capacitance of the network) between the selected propagation FET and the input node 10, the greater the propagation delay will be and, thus, the greater the phase adjustment will be. Contrarily, the closer the electrical distance between the selected propagation FET and the input node 10, the smaller the phase adjustment will be.

Figure 3A:
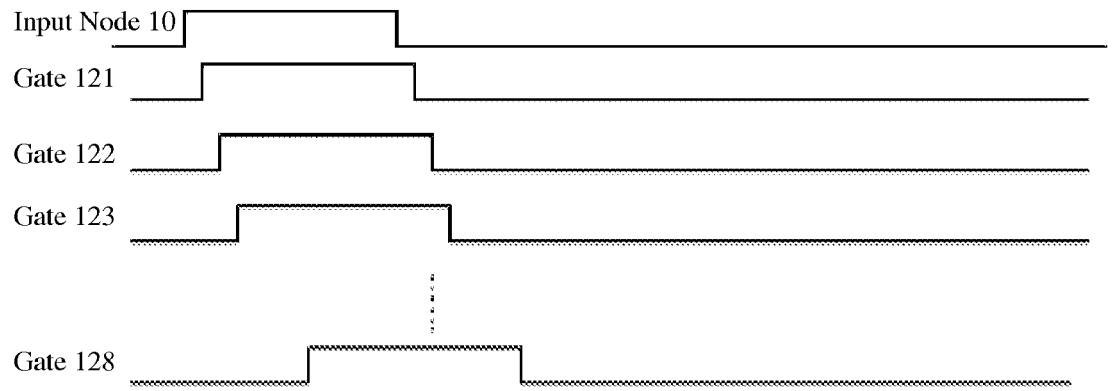
FIG. 3a is a diagram illustrating latency in the series connection.
Figure 3B:
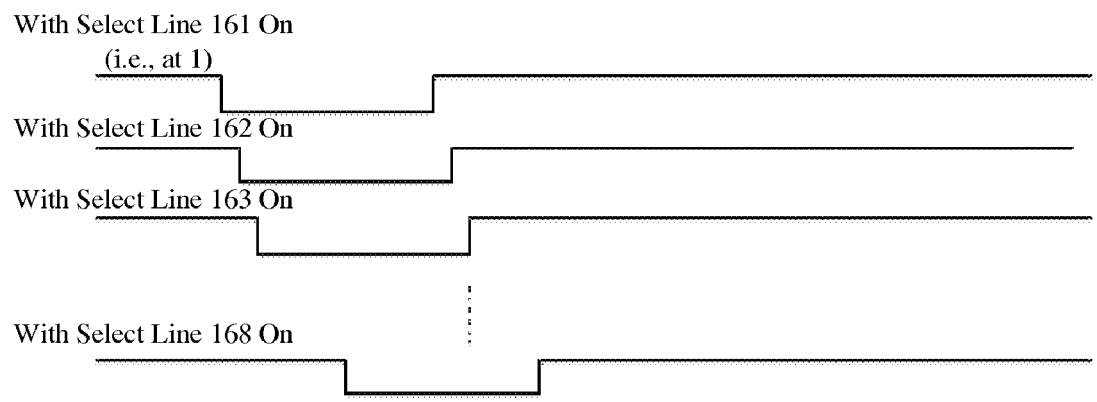
FIG. 3b is a diagram illustrating output signal delay, when a single propagation FET is selected.

FIG. 3a in combination with FIG. 1 illustrates the latency generated within the series connection 70 from signal input at the input node 10 to the last gate 128 in the series. FIG. 3b further illustrates the delay in the output signal measured at the output node 30 connected to output diffusion regions 131-138 for propagation FETs 111-118, the selection of which is controlled via select lines 161-168 for switches 151-158, respectively. Thus, referring again to FIG. 2, when switch 151 controlled by select line 161 is turned on, minimal phase adjustment is provided because the time delay between application of the input signal active edge to input node 10 and activation of the gate 121 is minimal. Turning on later switches 152-158 via select lines 162-168, respectively, allows for incremental increases in the latency between the time at which the active edge of the signal is input into the input node 10 and the inverting output is provided at the output node 30.

Alternatively, during operation of this phase adjusting circuit, multiple propagation FETs can be selected (i.e., some of the eight control lines 161-168 that control switches 151-158, respectively, can be held inactive (at 0) and some held active (at 1)) such that multiple input diffusion regions corresponding to multiple propagation FETs are selectively and simultaneously biased. When multiple input diffusion regions are selectively biased, impedance will remain high in the input diffusion regions of all of the other non-selected propagation FETs. When the first signal is driven into the input node and propagated sequentially through each of the gates in the series connection, channels will be enabled between the input diffusion regions and the output diffusion regions of each propagation FET. However, as the active edge of the first signal reaches the gate of the first selected FET (i.e., the first FET having a biased input diffusion region), a second signal (i.e., a phase adjusted signal) will begin passing through the first selected propagation FET to its corresponding output diffusion region. When the active edge of the first signal passes through the gate of the second selected propagation FET (i.e., the next FET having a biased input diffusion region), nothing happens because second signal has already been propagated. Similarly, when the inactive edge of the first signal passes through the gate of the first selected propagation FET, nothing happens because the output node continues to be driven to the second signal due to the biasing of input diffusion region of the second selected propagation FET. Only when the inactive edge of the first signal passes through the gate of the last selected propagation FET (i.e., the last FET having a biased input diffusion region) is the electrical connection broken (i.e., is transmission of the second signal broken), thereby allowing the output node to again be controlled by the current source. Thus, not only is the phase of the first signal adjusted, but also the length (i.e., the pulse width).

Figure 5:
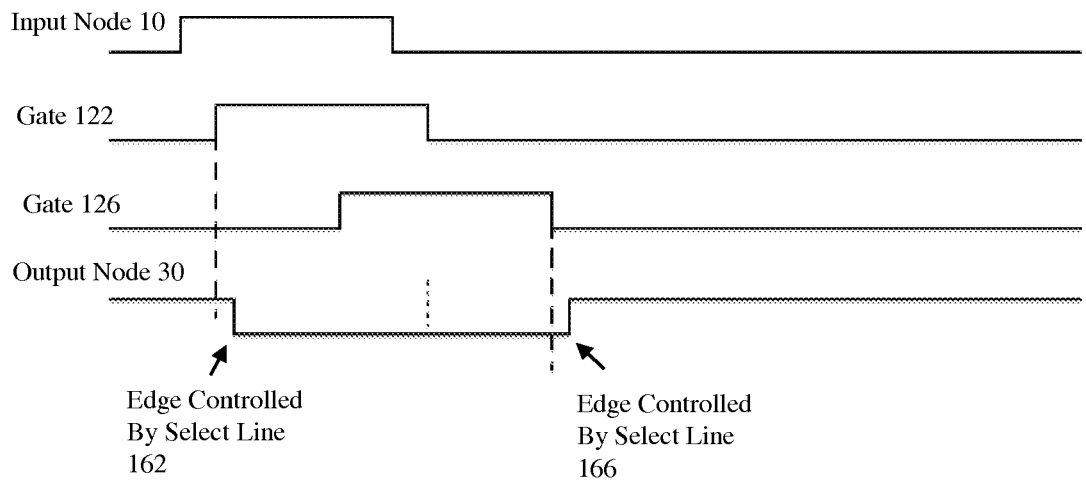
FIG. 5 is a diagram illustrating latency in the series connection, when two propagation FETs are selected.

The table of FIG. 4 provides two exemplary circuits states in which the input diffusion regions for two or more selected propagation FETs are biased. FIG. 5 illustrates the latency generated when two select lines (e.g., select lines 162 and 166) are enabled, as in the first example of FIG. 4. Specifically, the output node 30 of the phase delay circuit 100 of FIG. 1 inverts when the active edge of the input signal turns on gate 122 of propagation FET 112. As the input signal continues to propagate down the series connection 70 and reaches gate 126 of propagation FET 116, the gate 126 turns on reinforcing the connection between the voltage rail (e.g., ground 50) and the output node 30. Since propagation FET 112 was already turned on, the turn on of propagation FET 116 does not affect the inverting edge of the output node 30. When the inactive edge of the input signal reaches the gate 122 of propagation FET 112, propagation FET 112 turns-off and the channel between the ground 50 and the output node 30 through propagation FET 112 is disabled. However, because the inactive edge has not reached propagation FET 116 yet, the output node 30 is held. When the inactive edge reaches gate 126 of propagation FET 116, the remaining channel between the ground 50 and the output node 30 is disabled and the load device 90 pulls the output node 30 connected to the load device 90 to the opposing voltage rail (e.g., power source 60). The adjustment of turn-on/turn-off delay allows the pulse width through the phase shift circuit to be selectively widened. This may be used to counteract any pulse shrinkage in the path.

Figure 6:
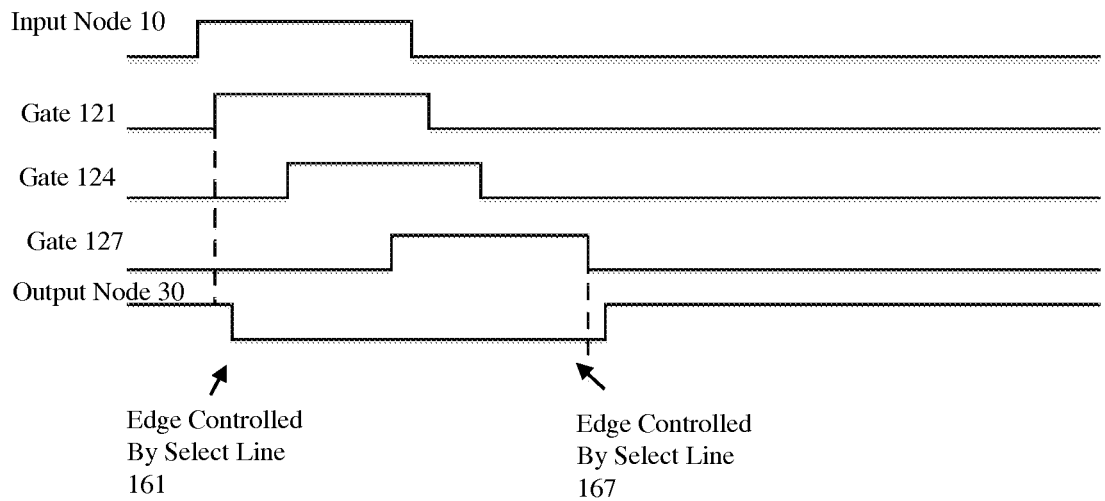
FIG. 6 is a diagram illustrating latency in the series connection, when more than two propagation FETs are selected.

FIG. 6 illustrates the latency generated when three select lines (e.g., select lines 161, 164 and 167) are enabled, as in the second example of FIG. 4. Specifically, select line 161 provides the selection of active edge delay, whereas select line 167 provides selection of inactive edge delay. Because selection line 164 controls neither the first selected switch-propagation FET pair, nor the last selected switch-propagation FET pair, it does not affect the pulse width of the circuit.

Delay and, thus, phase-adjustment is based, not only on which propagation FET(s) is/are selected (i.e., which input diffusion regions are selectively biased), but also on resistance and capacitance within the in series connection of the gates (i.e., RC delay). Thus, the variable delay device 20 in the phase adjusting circuit 100 can further be designed with propagation FETs having different sizes, with resistance (salicided or non-salicided) incorporated into the series connection 70 of the gates 121-128 and/or with capacitance incorporated into the series connection 70 of the gates 121-128 so as to fine tune the incremental changes in delay. Specifically, the propagation FETS of the variable delay device 20 can have uniform sizes so as to provide uniform delay increments or varying sizes so as to provide either non-uniform delay increments or to compensate for other delay inducing features in the circuit in order to ensure uniform delay increments. Additionally, referring to FIG. 7, the variable delay device 20 can comprise one or more resistors 711-717 and/or capacitors 721-727 incorporated into the series connection 70 of the gates 121-128 (i.e., connected in series with the gates 121-128). Resistors 711-717 may be connected between nodes 770 in the series connection 70 of the gates and may be constructed using any resistive layer available in semiconductor processing and may be non-silicided or silicided polysilicon, silicided or non-silicided diffusion, metallic resistance or other resistance as practicable. Capacitors 721-727 can be added to nodes 770 of the series connection 70 at select intervals to further increase the phase adjust available between each of the source regions. That is, charging of each of the gates 122-128 beyond gate 121 incurs a larger RC delay required to charge the added capacitance through the series gate connection 70. The capacitance addition may be practiced independently of the transistor type chosen for the propagation FETs or the use of additional resistance between propagation FET gates 121-128. In addition, capacitance need not be added to each gate node in the phase delay circuit structure, but may be added in a non-uniform manner if a non-uniform delay increment is desired. Finally, the series connection of the gates can comprise only silicide regions, only non-silicide region or a mixture of silicide and non-silicide regions, for example, on the gates themselves and/or between the gates to achieve the desired delay increment.

As mentioned above, the current source 90 (i.e., the load device) is connected between the output node 30 and a voltage rail (e.g., a power source 60) and is adapted to bias the output node 30 when all of the propagation FETs 111-118 are turned off. At the output node 30, the phase adjusted signal is combined with the load of the current source 90. In one embodiment of the phase adjusting circuit, as illustrated in FIG. 1, this current source 90 is a constant current source comprising, for example, a biased FET, a diode-connected FET or any other suitable device that is sized to provide appropriate signal swing)).

Figure 8:
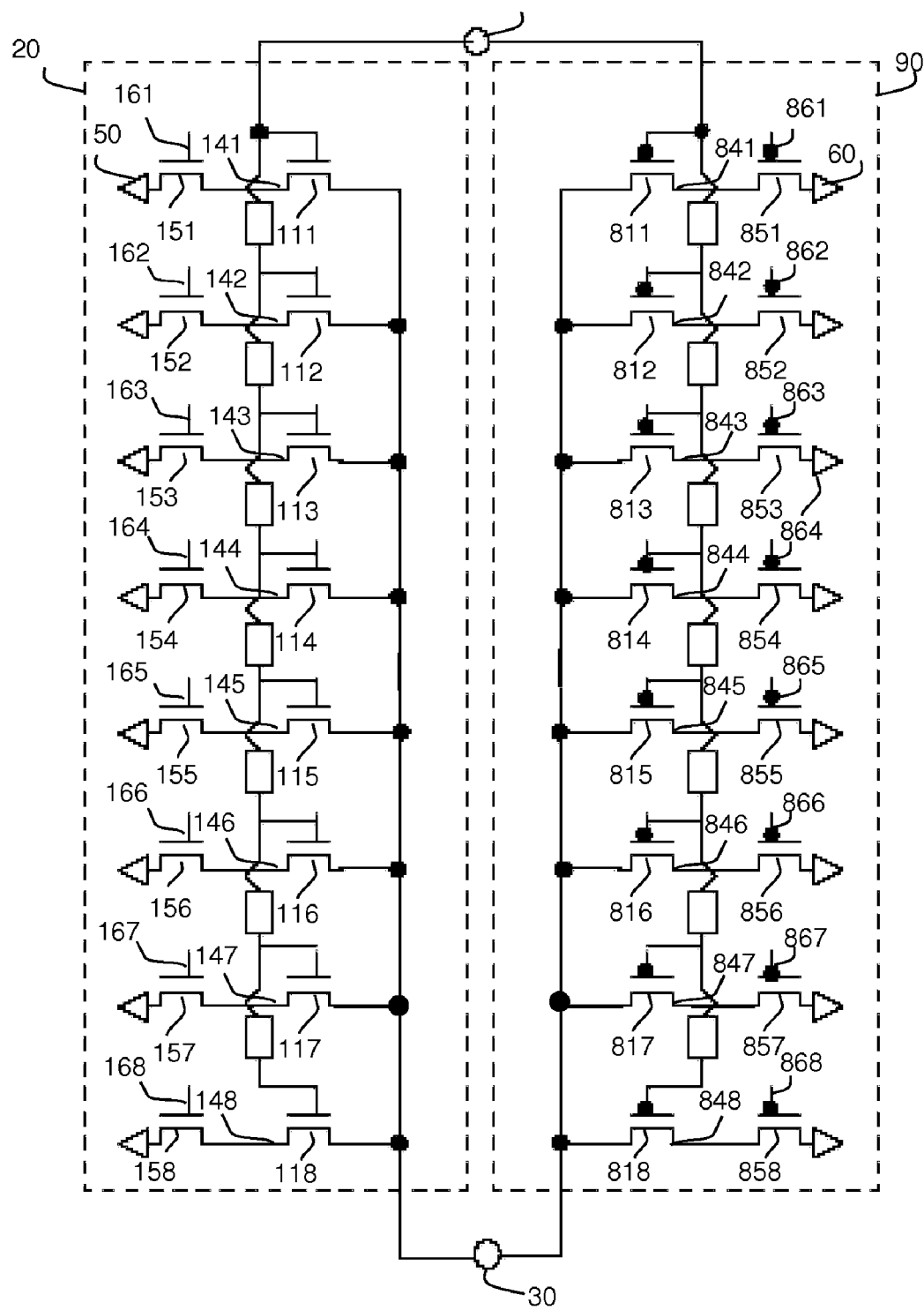
FIG. 8 is schematic diagram illustrating another embodiment of a phase adjusting circuit 800.

Alternatively, referring to FIG. 8, in another embodiment of the invention, the phase adjusting circuit can comprise the same components illustrated in FIG. 1 and described above. That is, the phase adjusting circuit can be configured with a variable delay device 20, as described above, connected between an input node 10 and an output node 30, etc. However, in this embodiment the current source 90 (i.e., the load device) connected between the output node and a voltage rail 60 is non-constant and dependent upon the same first signal at the input node 10 as the variable delay device 20. For example, the current source 90 can comprise at least one additional delay device that is also connected between the input and output nodes 10, 30 of the phase adjusting circuit (i.e., a common input feeds both the variable delay device 20 and additional delay device 90). As with the variable delay device 20, this additional delay device (i.e., current source 90) can be adapted to receive the first signal at the input node 10 and simultaneously, but independently, phase adjust the first signal. Thus, in this embodiment the output node 30 is adapted to combine the separate phase adjusted signals from both the different delay devices (i.e., from the variable delay device 20 and the additional delay device 90) such that the final output of the phase adjusting circuit at node 30 is a single combined phase adjusted signal. This additional delay device can comprise a non-variable delay device, another variable delay device or any other suitable delay device.

For example, as illustrated in FIG. 8, the additional delay device can comprise a second variable delay device that is configured in the same manner as variable delay device 20, but complementary thereto. Thus, the first variable delay device 20 and the second variable delay device (i.e., current source 90) each may have unique select controls. Specifically, in the first variable delay device select lines 161-168 control switches 151-158 in order to allow the input diffusion regions 141-148 of a first type (e.g., n-type) propagation FETs 111-118 to be selectively biased. Similarly, in the second variable delay device (i.e., current source 90) select lines 861-868 control switches 851-858 in order to allow the input diffusion regions 841-848 of opposite type (e.g., p-type) propagation FETs 811-818 to be selectively biased. Thus, the phase offset of the input-to-output delay may be tuned for both the active and inactive edges of the input (i.e., selection lines 161-168 of variable delay device 20 select the delay from input rising to output falling and selection inputs 861-868 of the second variable delay device (i.e., current source 90) select the delay from input falling to output rising).

Figure 9:
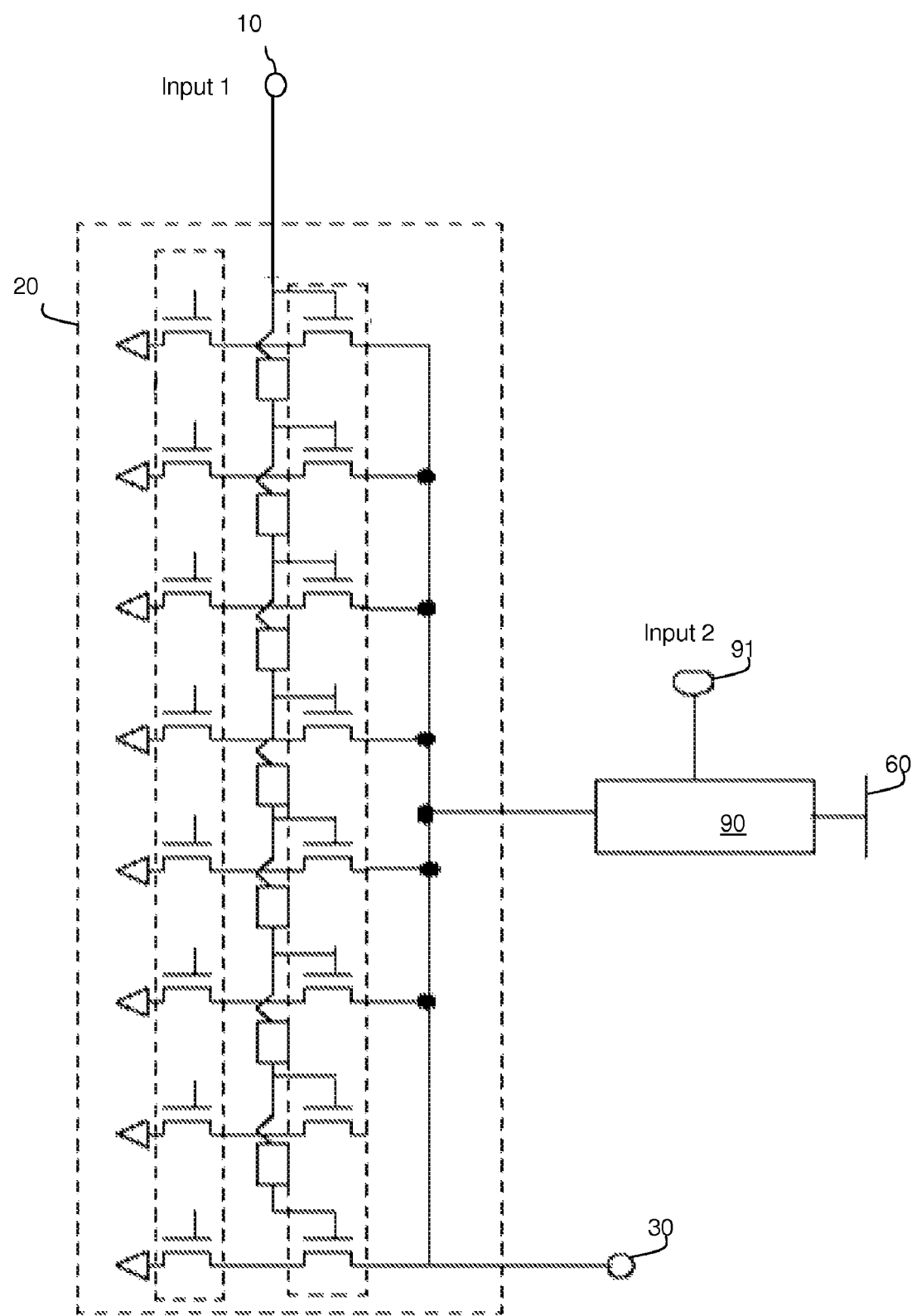
FIG. 9 is a schematic diagram illustrating an embodiment of a phase adjusting mixer circuit 900.

Referring to FIG. 9, in yet another embodiment of the invention, the phase adjusting circuit can comprise the same components illustrated in FIG. 1 and described above. That is, the phase adjusting circuit can be configured with a variable delay device 20 connected between an input node 10 and an output node 30, etc. However, in this embodiment the current source 90 (i.e., the load device) can be both non-constant and not dependent upon the first signal at the input node 10, but rather dependent upon a second input 91. Thus, the circuit in this embodiment functions as both a phase adjusting circuit and a mixer circuit. That is, in a phase adjusting mixer circuit as illustrated in FIG. 9, the current source 90 can be electrically connected to the output node 30 and a second input node 91, different from the first input node 10. Additionally, this current source 90 can be a time-varying current source (e.g., an alternating current (AC) source or a periodic current source) adapted to transmit a third signal to the output node 30. Thus, the output node 30 receives and combines the phase adjusted signal (i.e., the second signal) from the variable delay device 20 with the third signal from the current source 90 such that the final output of the phase adjusting mixer circuit comprises a fourth (mixed) signal.

Figure 7:
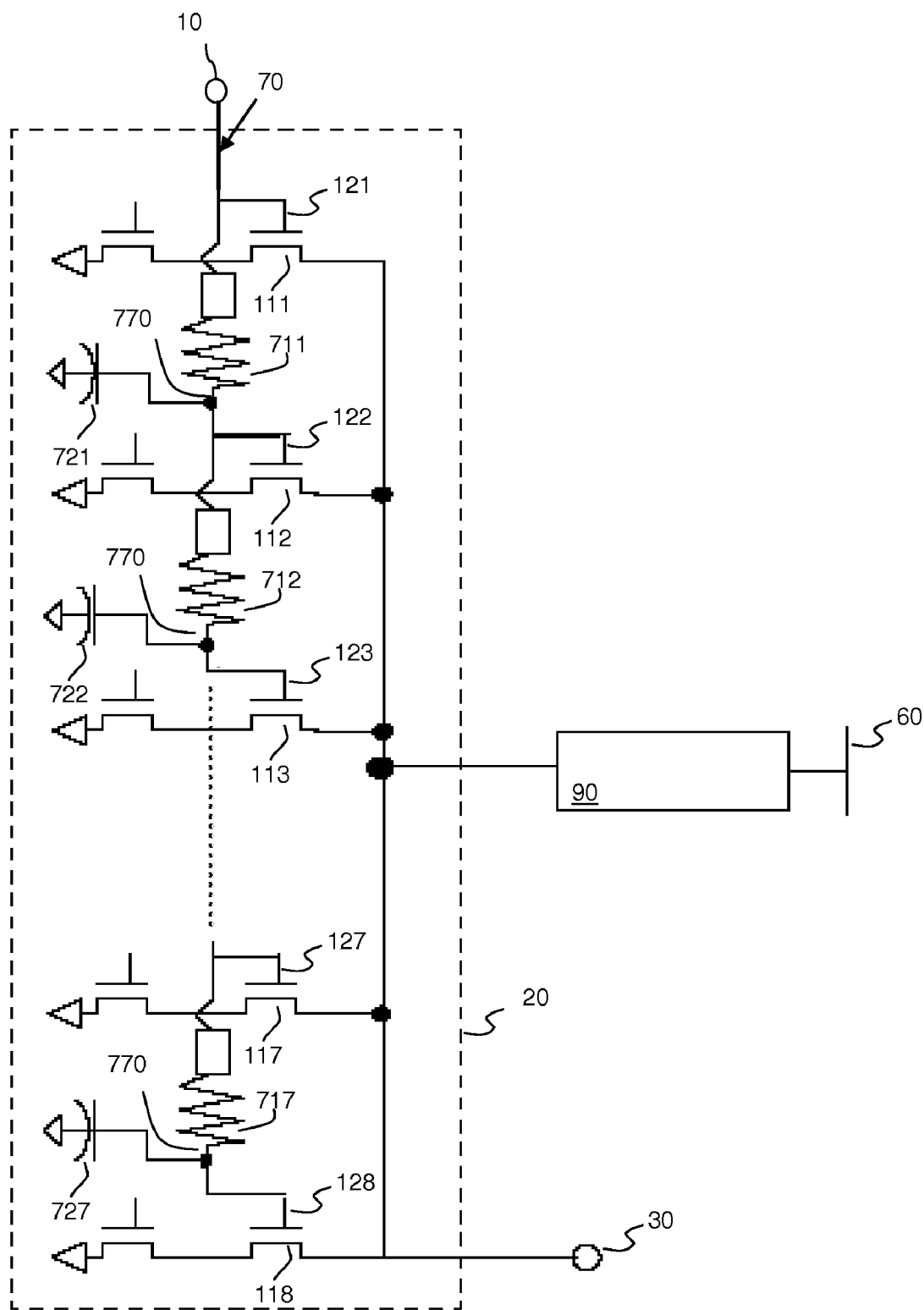
FIG. 7 is a diagram illustrating added resistance and capacitance in the series connection.
Figure 10:
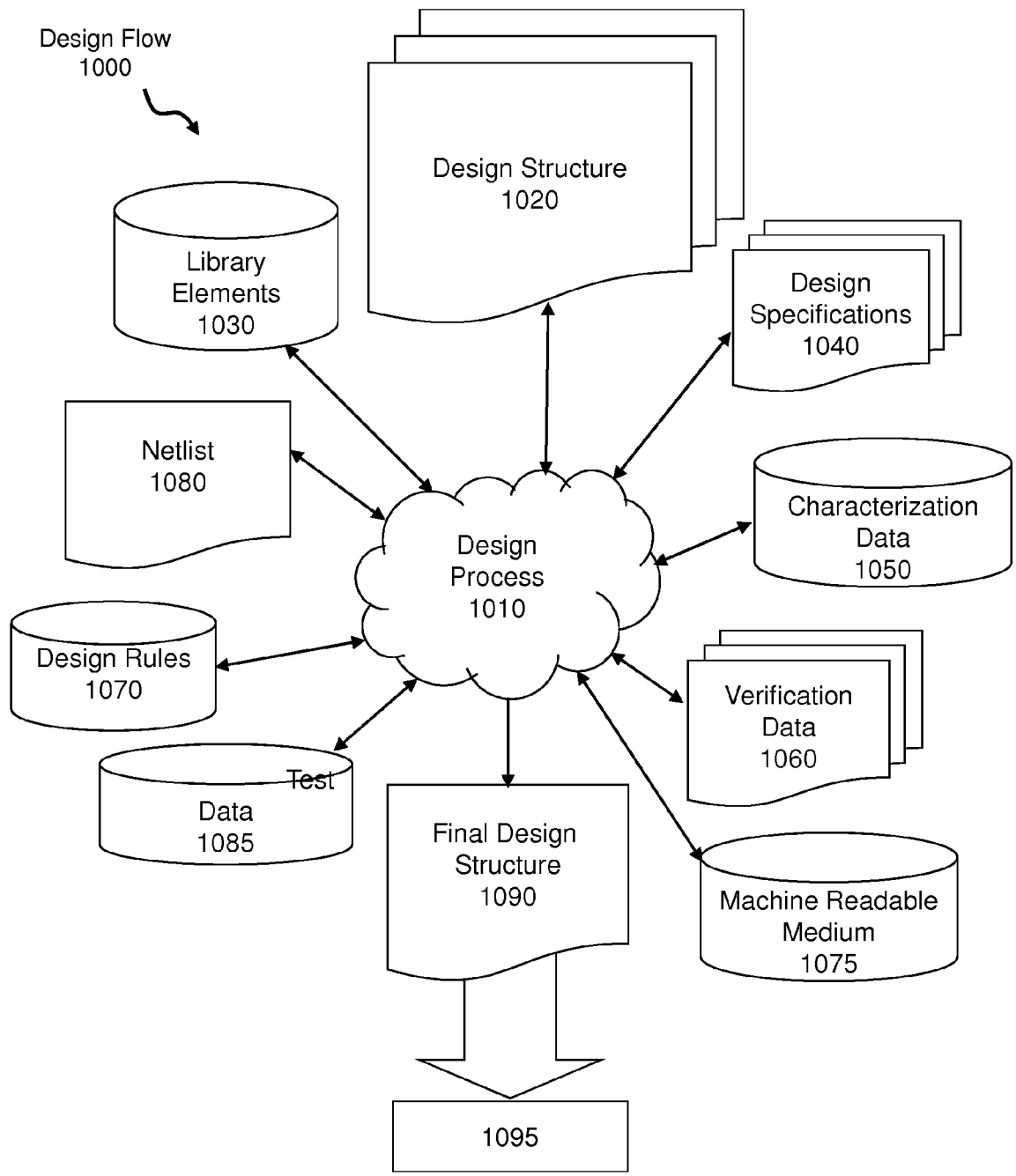
FIG. 10 shows a block diagram of an exemplary design flow 1100.

Also disclosed are embodiments of a design structure embodied in a machine readable medium used in a design flow process, where the design structure represents the phase adjusting and phase adjusting mixer circuits, discussed in detail above and illustrated in FIGS. 1, 7, 8, and 9. More specifically, FIG. 10 shows a block diagram of an example design flow 1000. Design flow 1000 may vary depending on the type of IC being designed. For example, a design flow 1000 for building an application specific IC (ASIC) will differ from a design flow 1000 for designing a standard component. Design structure 1020 is an input to a design process 1010 and may come from an IP provider, a core developer, or other design company. Design structure 1020 comprises circuit 100 of FIG. 1 and/or any of the other circuit embodiments disclosed herein (e.g., as illustrated in FIGS. 7-9) in the form of schematics or HDL, a hardware-description language, (e.g., Verilog, VHDL, C, etc.). Design structure 1020 may be stored on one or more of machine readable medium 1075 as shown in FIG. 10. For example, design structure 1020 may be a text file or a graphical representation of circuit 100 of FIG. 1 or of any of the other circuit embodiments disclosed herein (e.g., as illustrated in FIGS. 7-9). Design process 1010 synthesizes (or translates) circuit 100 or any of the other circuit embodiments disclosed herein into a netlist 1080, where netlist 1080 is, for example, a list of fat wires, transistors, logic gates, control circuits, I/O, models, etc. and describes the connections to other elements and circuits in an integrated circuit design and recorded on at least one of machine readable medium 1075.

Design process 1010 includes using a variety of inputs; for example, inputs from library elements 1030 which may house a set of commonly used elements, circuits, and devices, including models, layouts, and symbolic representations, for a given manufacturing technology (e.g. different technology nodes, 32 nm, 45 nm, 90 nm, etc.), design specifications 1040, characterization data 1050, verification data 1060, design rules 1070, and test data files 1085, which may include test patterns and other testing information. Design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the invention.

Ultimately design process 1010 translates circuit 100 or any of the other circuit embodiments disclosed herein, along with the rest of the integrated circuit design (if applicable), into a final design structure 1090 (e.g., information stored in a GDS storage medium 1075). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100 or any of the other circuit embodiments disclosed herein. Final design structure 1090 may then proceed to a stage 1095 of design flow 1000; where stage 1095 is, for example, where final design structure 1090: proceeds to tape-out, is released to manufacturing, is sent to another design house or is sent back to the customer.

Figure 11:
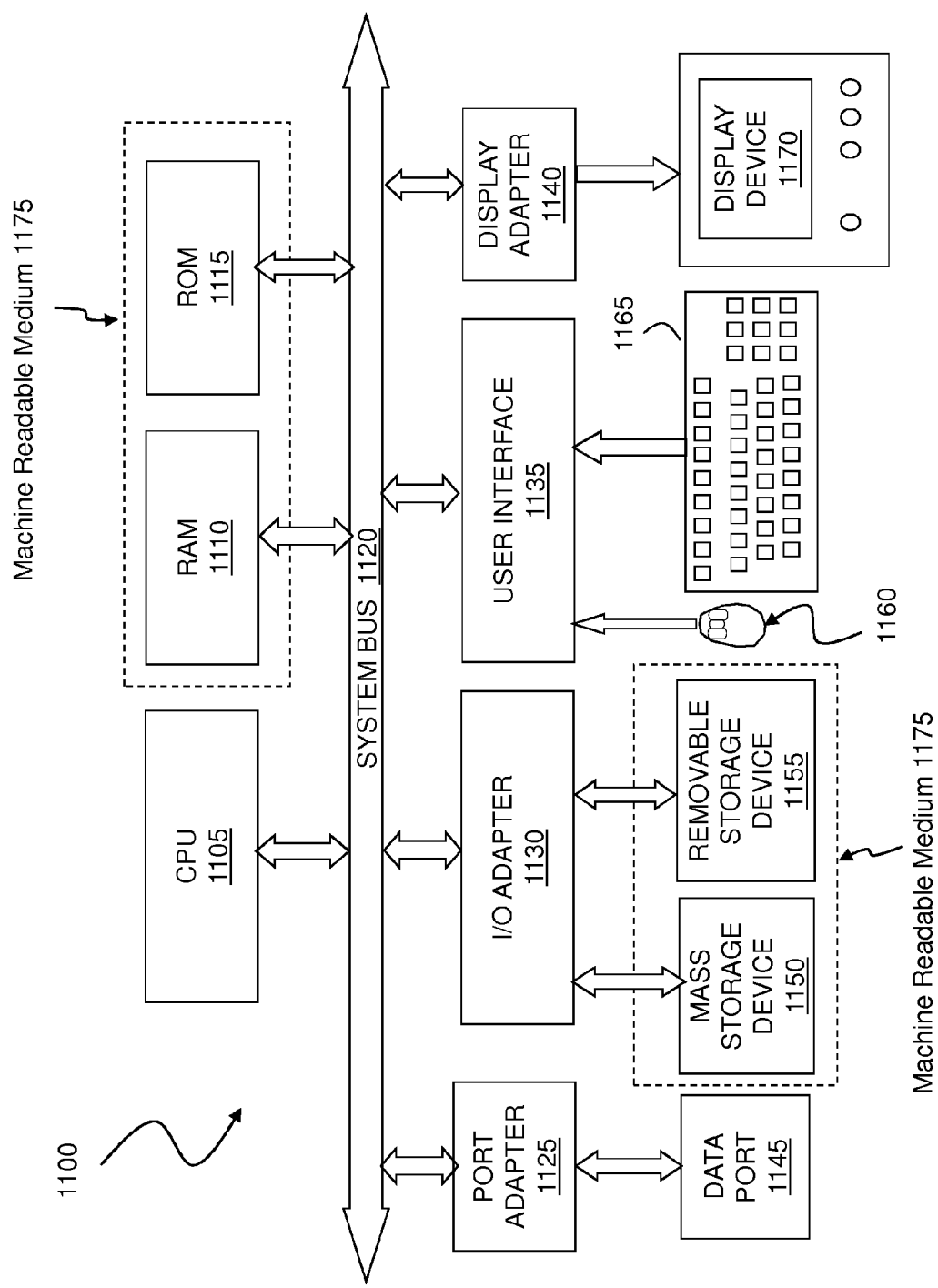
FIG. 11 is a schematic block diagram of a general-purpose computer system 1000 for practicing the design process.

FIG. 11 is a schematic block diagram of a general-purpose computer system 1100 for practicing the design process, discussed above. The computer system 1100 has at least one microprocessor or central processing unit (CPU) 1105. CPU 1105 is interconnected via a system bus 1120 to machine readable media 1175, which includes, for example, a random access memory (RAM) 1110, a read-only memory (ROM) 1115, a removable and/or program storage device 1155 and a mass data and/or program storage device 1150. An input/output (I/O) adapter 1130 connects mass storage device 1150 and removable storage device 1155 to system bus 1120. A user interface 1135 connects a keyboard 1165 and a mouse 1160 to system bus 1120, and a port adapter 1125 connects a data port 1145 to system bus 1120 and a display adapter 1140 connect a display device 1170. ROM 1115 contains the basic operating system for computer system 1100. Examples of removable data and/or program storage device 1155 include magnetic media such as floppy drives, tape drives, portable flash drives, zip drives, and optical media such as CD ROM or DVD drives. Examples of mass data and/or program storage device 1150 include hard disk drives and non-volatile memory such as flash memory. In addition to keyboard 1165 and mouse 1160, other user input devices such as trackballs, writing tablets, pressure pads, microphones, light pens and position-sensing screen displays may be connected to user interface 1135. Examples of display device 1170 include cathode-ray tubes (CRT) and liquid crystal displays (LCD).

A machine readable computer program may be created by one of skill in the art and stored in computer system 1100 and/or any one or more of machine readable medium 1175 to simplify the practicing of this invention. That is, the design structure 1090 of FIG. 10 may be embodied in a machine readable medium 1175 and this machine readable medium 1175 may be used in the design process 1010 of FIG. 10, where the design structure 1090 represents the phase adjusting and phase adjusting mixer circuits, discussed in detail above and illustrated in FIGS. 1, 7, 8, and 9. In operation, information for the computer program created to run the present invention is loaded on the appropriate removable data and/or program storage device 1155, fed through data port 1145 or entered using keyboard 1165. A user controls the program by manipulating functions performed by the computer program and providing other data inputs via any of the above mentioned data input means. Display device 1170 provides a means for the user to accurately control the computer program and perform the desired tasks described herein.

Therefore, disclosed above are embodiments of a programmable phase adjusting circuit, a programmable phase adjusting mixer circuit and design structures for these circuits. The programmable phase adjusting circuit comprises a variable delay device connected between an input node for receiving a signal requiring phase adjustment and an output node for outputting a phase adjusted signal. The variable delay device is made up of multiple propagation field effect transistors (propagation FETs). The propagation FETs have input diffusion regions that are connected to a voltage rail via switches so that they can be selectively biased, gates that are connected in series to the input node such that the signal requiring phase adjustment can be propagated sequentially through each of the gates and output diffusion regions that are connected in parallel to the output node. A current source (i.e., load device) is connected between the output node and another voltage rail (e.g., a power source) and is adapted to bias the output node when the variable delay device is off. This load device can be constant, non-constant and dependent upon the signal at the input node or, as in a phase adjusting mixer circuit, non-constant and independent of the signal at the input node. This variable delay device enables a phase adjusting circuit in which small increments of selectable phase adjustments can be made to a periodic input signal as a function of which propagation FET(s) is/are selected (i.e., as a function of propagation delay). During design, the delay can be tuned by varying the size of the propagation FETs, by incorporating resistance (salicided or non-salicided) into the series connection of the gates and/or by incorporating capacitance into series connection of the gates.

The programmable phase adjusting circuit, disclosed above, may be used to economically and selectively delay clock edges, data edges or both in a clock and data recovery system (CDR) such as a high speed serial link. In alternative applications, the circuit may be used to resolve early mode timing violations in digital logic. Further, the circuit provides a means to tune the delay of a signal during design of an IC, as the result of IC final test post manufacture and/or throughout IC product lifetime as controlled by delay select lines.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims. For example, the transition directions specified above with regard to operation of the phase adjusting circuit were provided for illustration purposes only. These transition directions were not intended to be limiting and those skilled in the art will recognize that circuit operation is possible with reverse transition directions.

What is claimed is:

1. A design structure embodied in a machine readable medium used in a design flow process, said design structure comprising a phase adjusting circuit comprising:
    an input node for receiving a first signal;
    an output node;
    a variable delay device comprising a plurality of field effect transistors comprising input diffusion regions adapted to be selectively biased, gates connected in series to said input node such that said first signal is propagated to said gates sequentially and output diffusions regions connected in parallel to said output node; and
    a current source connected to said output node and adapted to bias said output node when all of said field effect transistors are off,
    wherein a second signal is transmitted through a selected field effect transistor to said output node when an input diffusion region of said selected field effect transistor is selectively biased and when an active edge of said first signal is propagated from said input node to a gate of said selected field effect transistor, and
    wherein a phase difference between said first signal and said second signal is based on delay in propagation of said first signal from said input node to said gate.

2. The design structure of claim 1, wherein said design structure comprises a netlist, which describes said phase adjusting circuit.

3. The design structure of claim 1, wherein said design structure resides on a geographically dispersed sites (GDS) storage medium.

4. The design structure of claim 1, wherein said design structure comprises at least one of test data files, characterization data, verification data and design specifications.

5. A design structure embodied in a machine readable medium used in a design flow process, said design structure comprising a phase adjusting circuit comprising:
    an input node for receiving a first signal;
    an output node;
    a variable delay device comprising:
        a plurality of field effect transistors comprising input diffusion regions, gates, and output diffusion regions;
        a series connection connecting said input node to each of said gates in series such that said first signal is propagated to said gates sequentially and encounters intrinsic delays within said series connection between said gates;
        a parallel connection connecting each of said output diffusions regions in parallel to said output node; and
        a plurality of switches corresponding to said plurality of field effect transistors, said switches being connected between said input diffusions regions of said field effect transistors and a first voltage rail so as to allow selective biasing of said input diffusion regions; and,
    a current source connected to said output node and adapted to bias said output node when all of said field effect transistors are off,
    wherein, when a selected switch is turned on such that an input diffusion region of a corresponding selected field effect transistor is selectively biased and when an active edge of said first signal is propagated from said input node to a gate of said selected field effect transistor, a second signal is transmitted through said selected field effect transistor to said output node, and
    wherein a phase difference between said first signal and said second signal is based on delay in propagation of said first signal from said input node to said gate.

6. The design structure of claim 5, wherein said switches comprise field effect transistors.

7. The design structure of claim 5, wherein, if only one input diffusion region is selectively biased, when an inactive edge of said first signal reaches said gate, transmission of said second signal through said selected field effect transistor to said output node is broken.

8. The design structure of claim 5, wherein, if multiple input diffusion regions are selectively and simultaneously biased:
    when said active edge of said first signal reaches a first gate of a first selected field effect transistor, said second signal is transmitted through said first selected field effect transistor to said output node,
    when an inactive edge of said first signal reaches said first gate, said second signal is transmitted through a next selected field effect transistor to said output node, and
    when said inactive edge of said first signal reaches a last gate of a last selected field effect transistor, transmission of said second signal to said output node is broken.

9. The design structure of claim 5, wherein said field effect transistors have uniform sizes.

10. The design structure of claim 5, wherein said variable delay device further comprises a plurality of resistors within said series connection between said gates such that said first signal encounters additional delays.

11. The design structure of claim 5, wherein said variable delay device further comprises a plurality of capacitors connected between said first voltage rail and nodes within said series connection between said gates.

12. The design structure of claim 5, wherein said variable delay device comprises a mixture of silicide regions and non-silicide regions on said gates and connections between said gates.

13. The design structure of claim 5, wherein said current source is constant and connected between said output node and a second voltage rail and wherein said output node is adapted to combine said second signal and a load from said current source.

14. A design structure embodied in a machine readable medium used in a design flow process, said design structure comprising a phase adjusting circuit comprising:
    an input node for receiving a first signal;
    an output node;
    a variable delay device comprising a plurality of field effect transistors comprising input diffusion regions adapted to be selectively biased, gates connected in series to said input node such that said first signal is propagated to said gates sequentially and output diffusions regions connected in parallel to said output node; and
    a current source connected to said output node and adapted to bias said output node when all of said field effect transistors are off,
    wherein, when an input diffusion region of a selected field effect transistor is selectively biased and when an active edge of said first signal is propagated from said input node to a gate of said selected field effect transistor, a second signal is transmitted through said selected field effect transistor to said output node,
    wherein a phase difference between said first signal and said second signal is based on delay in propagation of said first signal from said input node to said gate,
    wherein said current source comprises at least one additional delay device connected to said input node and said output node, wherein said additional delay device is adapted to receive and phase adjust said first signal simultaneously with said variable delay device, and wherein said output node is adapted to combine phase-adjusted signals from both said variable delay device and said at least one additional delay device.

15. The design structure of claim 14, wherein said at least one additional delay device comprises a second variable delay device.

16. A design structure embodied in a machine readable medium used in a design flow process, said design structure comprising a phase adjusting circuit comprising:

an input node for receiving a first signal;
an output node;
a variable delay device comprising:
    a plurality of field effect transistors comprising input diffusion regions, gates, and output diffusion regions;
    a series connection connecting said input node to each of said gates in series such that said first signal is propagated to said gates sequentially and encounters intrinsic delays within said series connection between said gates;
    a parallel connection connecting each of said output diffusions regions in parallel to said output node; and
    a plurality of switches corresponding to said plurality of field effect transistors, said switches being connected between said input diffusions regions of said field effect transistors and a first voltage rail so as to allow selective biasing of said input diffusion regions,
wherein, when a selected switch is turned on such that an input diffusion region of a corresponding selected field effect transistor is selectively biased and when an active edge of said first signal is propagated from said input node to a gate of said selected field effect transistor, a second signal is transmitted through said selected field effect transistor to said output node, and wherein a phase difference between said first signal and said second signal is based on delay in propagation of said first signal from said input node to said gate; and a current source connected to said output node,
wherein said current source is non-constant, independent of said first signal and is adapted to transmit a third signal to said output node, and
wherein said output node is adapted to combine said second signal and said third signal.

17. The design structure of claim 16, wherein, if only one input diffusion region is selectively biased, when said active edge of said first signal reaches said gate, said second signal is transmitted to said output node through said selected field effect transistor and, when an inactive edge of said first signal reaches said gate, transmission of said second signal to said output node is broken.

18. The design structure of claim 16, wherein, if multiple input diffusion regions are selectively biased:
    when said active edge of said first signal reaches a first gate of a first selected field effect transistor, said second signal is transmitted through said first selected field effect transistor to said output node,
    when an inactive edge of said first signal reaches said first gate, said second signal is transmitted through a next selected field effect transistor to said output node, and
    when said inactive edge of said first signal reaches a last gate of a last selected field effect transistor, transmission of said second signal to said output node is broken.

19. The design structure of claim 16, wherein said field effect transistors have uniform sizes.

20. The design structure of claim 16, wherein said field effect transistors have different sizes.

* * * * *